(12) United States Patent
Ishii

(10) Patent No.: US 6,433,298 B1
(45) Date of Patent: Aug. 13, 2002

(54) PLASMA PROCESSING APPARATUS

(75) Inventor: Nobuo Ishii, Minoo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/665,068

(22) Filed: Sep. 19, 2000

Related U.S. Application Data (63) Continuation of application No. PCT/JP99/01415, filed on Mar. 19, 1999.

(30) Foreign Application Priority Data

Mar. 20, 1998 (JP) ............................................. 10-092497

(51) Int. Cl.$^7$ ............................................... B23K 10/00
(52) U.S. Cl. .............................. 219/121.43; 219/121.4; 219/121.51; 118/723 MW; 156/345
(58) Field of Search .................... 219/121.52, 121.41, 219/121.4, 121.43, 121.48, 746, 750; 118/723 MW; 156/345

(56) References Cited

U.S. PATENT DOCUMENTS

| | | | |
|---|---|---|---|
| 5,389,153 A | * | 2/1995 | Paranjpe et al. ........ 118/723 MP |
| 5,734,143 A | * | 3/1998 | Kawase et al. .......... 219/121.43 |
| 5,968,275 A | * | 10/1999 | Lee et al. ................. 118/723 I |
| 6,172,321 B1 | * | 1/2001 | Yoshika et al. ......... 219/121.41 |

FOREIGN PATENT DOCUMENTS

| | | |
|---|---|---|
| JP | 1-184921 | 7/1989 |
| JP | 7-135093 | 5/1995 |
| JP | 7-135094 | 5/1995 |
| JP | 7-230898 | 8/1995 |
| JP | 7-326495 | 12/1995 |
| JP | 8-148486 | 6/1996 |
| JP | 8-222557 | 8/1996 |

* cited by examiner

*Primary Examiner*—Mark Paschall
(74) *Attorney, Agent, or Firm*—Finnegan, Henderson, Farabow, Garrett & Dunner LLP (57) ABSTRACT

A plasma processing apparatus has a vacuum vessel 2, an annular, transparent plate 23 put on the upper open end of the vacuum vessel 2 and a shower head 50 fitted in an opening formed in a central part of the annular transparent plate 23. A waveguide 25 has an outer guide member 25b and an inner guide member 25a connected to the shower head 50. Film forming gases including a CF gas is supplied through the inner guide member 25a and the shower head 50 into the vacuum vessel 2. A plasma producing gas, such as Ar gas, is supplied through an opening formed in the side wall at a position above the ECR point into the vacuum vessel 2. Active species of the film forming gases are distributed uniformly over the surface of a wafer. The interior of the shower head 50 formed of a metal is not contaminated with particles because the plasma does not flow into the shower head 50.

6 Claims, 8 Drawing Sheets

PLASMA PROCESSING APPARATUS

CROSS-REFERENCE TO RELATED APPLICATION

This application is a continuation of International Application No. PCT/LP99/01415, filed Mar. 19, 1999.

TECHNICAL FIELD

The present invention relates to a plasma processing apparatus utilizing electron cyclotron resonance.

BACKGROUND OF ART

Recently, the ECR (electron cyclotron resonance) plasma processing method using a plasma for a film forming process or an etching process has attracted much attention. The ECR plasma processing method causes microwave discharge by using the resonance of the cyclotron motion of electrons in a magnetic field and a microwave. Since the ECR plasma processing method is able to produce a high-density plasma in a high vacuum by electrodeless discharge. the ECR plasma processing method is capable of achieving high-speed surface processing and of processing semiconductor wafers (hereinafter referred to simply as "wafers") without contaminating the same.

A conventional ECR plasma processing apparatus as applied to a film forming apparatus that carries out a film forming process will be described with reference to FIG. 11. A microwave 91 of, for example, 2.45 GHz is guided into a plasma producing chamber 1A by a waveguide, not shown, and, at the same time, a magnetic field of, for example, 875 G is created by a solenoid 10 in the plasma producing chamber 1A. A plasma producing gas 92 is ionized by the agency of interaction (resonance) between the microwave and the magnetic field to produce a high-density plasma A reactive gas 93 supplied from one side of a film forming chamber 1B is activated by the plasma to produce active species. A surface of a silicon wafer W supported on a table connected to a high-frequency power source 12 is etched by sputtering and, at the same time, a film is deposited on the surface of the silicon wafer W. Thus, the ECR plasma processing apparatus carries out simultaneously processes that are opposed to each other in effect, i.e., a sputter etching process and a film forming process. The ECR plasma processing apparatus is controlled, on the whole, so that the film deposition process is dominant and a film can be deposited.

A fluorine-containing carbon film (hereinafter referred to as "CF film"), which is an effective insulating film having a small relative dielectric constant, is an attractive film under circumstances where miniaturization of semiconductor devices and development of high-speed semiconductor devices are desired. The inventors of the present invention are studying a method of depositing a CF film on a surface of a wafer by an ECR plasma process using a CF gas, such as $C_4F_8$, as a reactive gas.

Figure 11:
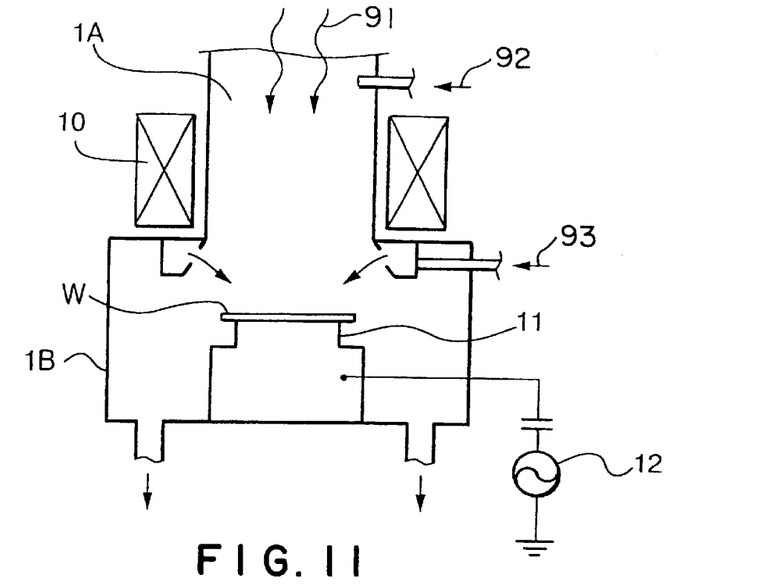
FIG. 11 is a typical view of a conventional plasma film forming apparatus.
Figure 12:
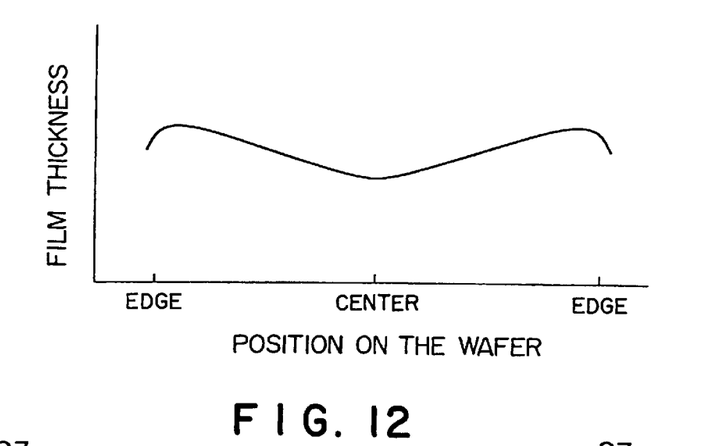
FIG. 12 is a graph showing a thickness distribution in a CF film formed by using the conventional plasma film forming apparatus.

When a CF film is deposited on a surface of a wafer by using the conventional processing apparatus shown in FIG. 11, a portion of the CF film covering a peripheral region of the surface of the wafer is thick and a portion of the same covering a central region of the surface of the wafer is thin as shown in FIG. 12. This tendency is more remarkable with a larger wafer.

Figure 13:
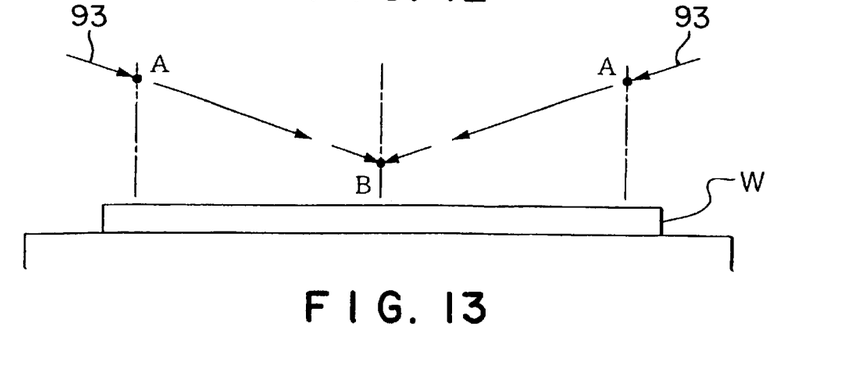
FIG. 13 is a diagram of assistance in explaining causes of the thickness distribution shown in FIG. 12.

Causes of such an irregular film thickness distribution as shown in FIG. 12 have not been elucidated. The inventors of the present invention infer that such an irregular film thickness distribution is attributable to the following causes. The CF gas 93 is supplied into the film forming chamber 1B from an upper peripheral region of the film forming chamber 1B so as to flow toward a central region B corresponding to the center of the wafer as shown in FIG. 13. Consequently, the dissociation of the CF gas in the plasma progresses as the CF gas approaches the central region B corresponding to the center of the wafer and F atom (fluorine atom) concentration at a point B is greater than that at a point A in FIG. 13. F atoms produced by the dissociation of the CF gas etches a CF film deposited on the surface of the wafer. It is therefore inferred that the portion of the CF film covering the central region of the surface of the wafer is etched at a higher etch rate than the portion of the same covering the peripheral region of the surface of the wafer and, consequently, the thickness of the portion of the CF film covering the central region of the surface of the wafer is smaller than that of the portion of the CF film covering the peripheral region of the surface of the wafer.

The present invention has been made under such circumstances and it is therefore an object of the present invention to provide a plasma processing apparatus capable of uniformly processing a surface of a workpiece, such as a wafer, by using a plasma.

DISCLOSURE OF THE INVENTION

According to an invention stated in claim 1, a plasma processing apparatus comprising: a vacuum vessel; a stage disposed in the vacuum vessel to support a substrate thereon; a waveguide connected to the vacuum vessel from outside the vacuum vessel, the waveguide having a cylindrical outer guide member and a cylindrical inner guide member extended in the outer guide member so as to propagate a high-frequency wave through a space between the outer and the inner guide member into the vacuum vessel and so as to supply a gas through the inner guide member into the vacuum vessel from a position opposite the stage; and a high-frequency wave transmitting plate of a dielectric material disposed opposite to the stage and hermetically separating the space between the outer and the inner guide member from a space defined by the vacuum vessel; wherein a gas supplied into the vacuum vessel is ionized by the high-frequency wave propagated through the transparent plate to produce a plasma, and the substrate is processed.

According to an invention stated in claim 2, the outer and the inner guide member of the waveguide are coaxial.

According to an invention stated in claim 3, the waveguide, the inner guide member and the outer guide member are a first waveguide, a first inner guide member and a first guide member, respectively, a first waveguide is surrounded by a second waveguide having a second inner guide member surrounding the first waveguide and a second outer guide member surrounding the second inner guide member, the high-frequency wave is propagated through a space between the second inner guide member and the second outer guide member of the second waveguide, and the gas is supplied through a space between the second inner guide member of the second waveguide and the first outer guide member of the first waveguide.

According to an invention stated in claim 4, an end part of the outer guide member of the waveguide on the side of the stage is provided with a cylindrical antenna cover of a conductive material radially extending in the shape of a flange and axially extending toward the stage, and a microwave transmitting plate of a dielectric material is placed between the inside of the antenna cover and an end of the inner guide member of the waveguide on the side of the stage.

According to an invention stated in claim 5, the plasma processing apparatus further includes a magnetic field creating device capable of creating a predetermined magnetic field, wherein an ECR plasma is produced by interaction of the predetermined high-frequency wave and the predetermined magnetic field.

According to an invention stated in claim 6, the plasma processing apparatus further includes a shower head of a conductive material disposed in an end of a gas supply passage formed in the waveguide on the side of the stage and provided with a plurality of gas spraying holes opening toward the stage.

According to an invention stated in claim 7, the gas is a film forming gas containing carbon and fluorine.

According to an invention stated in claim 8, the gas is an etching gas.

BEST MODE FOR CARRYING OUT THE INVENTION

Figure 1:
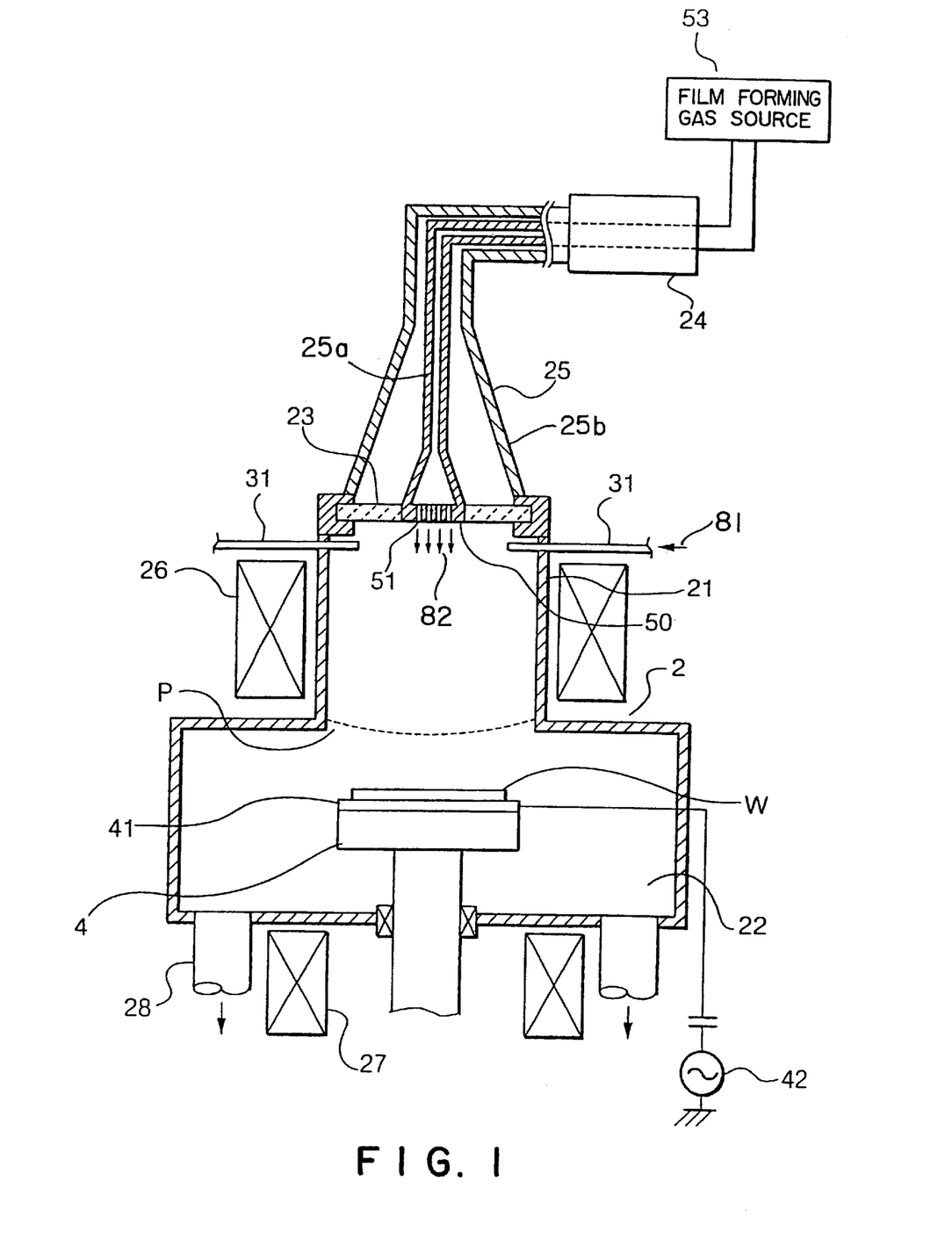
FIG. 1 is a schematic sectional view of a plasma processing apparatus in a first embodiment according to the present invention for carrying out a film forming process.

FIG. 1 is a schematic sectional view of a plasma processing apparatus in a first embodiment according to the present invention for carrying out a film forming process. The plasma processing apparatus propagates a microwave and supplies a film forming gas into a vacuum vessel 2 of, for example, aluminum from above a wafer W placed in the vacuum vessel 2.

The vacuum vessel 2 has a cylindrical first vacuum chamber 21 in which a plasma is produced and a second vacuum chamber 22 having a diameter greater than that of the first vacuum chamber 21 and connected to the lower end of the first vacuum chamber 21. The vacuum vessel 2 is grounded. The upper open end of the vacuum vessel 2 is covered hermetically with an annular, transparent plate 23 of a dielectric material that transmits microwaves, such as quartz, or aluminum nitride, to maintain the interior of the vacuum vessel 2 in a vacuum state. A waveguide 25 having, in a coaxial arrangement, an inner guide member 25a and an outer guide member 25b is disposed on the outer side of the transparent plate 23. The inner guide member 25a and the outer guide member 25b of the waveguide 25 are formed of a conductive material, such as a metal. The waveguide 25 guides the propagation of a high-frequency wave through a path formed between the inner guide member 25a and the outer guide member 25b. The waveguide 25 is connected to a high-frequency power source 24 that generates a microwave of 2.45 GHz. The microwave generated by the high-frequency power source 24 is propagated in, for example, the TEM mode into the waveguide 25 or a microwave propagated in the TE mode or the TM mode is converted into a microwave that is propagated in the TEM mode by the waveguide 25, and the microwave is introduced through the transparent plate 23 into the first vacuum chamber 21. Although the microwave may be propagated into the first vacuum chamber 21 in any one of the TE mode, the TM mode and the TEM mode, it is preferable that the microwave is propagated in the TEM mode because the microwave has neither electric nor magnetic field vector in the direction of propagation as shown in FIG. 3 and the microwave propagated in the TEM mode is less subject to disturbance.

Figure 2A:
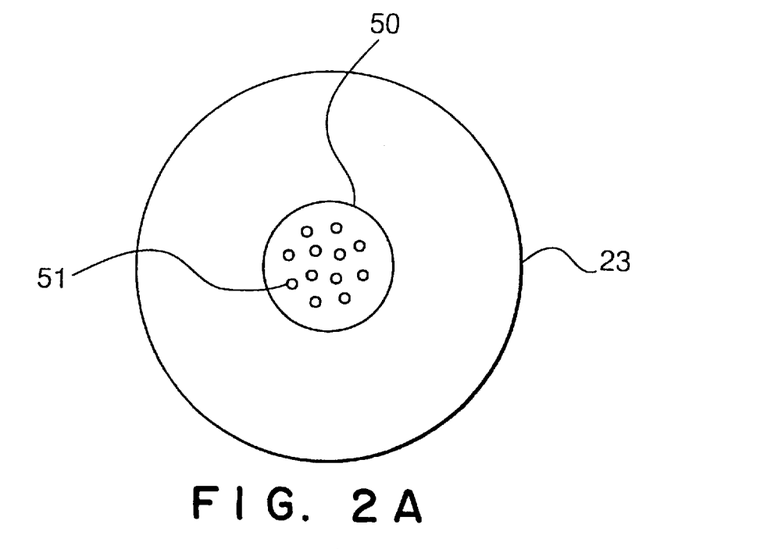
FIG. 2A is a bottom view of a microwave transmitting plate and a gas supply part.

As shown in FIGS. 1 and 2A, a shower head 50, i.e., a gas delivering member through which the film forming gas 82, such as CF gas, is delivered, is fitted in an opening formed in a central part of the annular transparent plate 23. The shower head 50 is formed of a conductive material, such as a metal, and is provided with a plurality of gas spraying holes 51 opening toward a stage 4. The inner guide member 25a of the waveguide 25 has a base end part connected to an external film forming gas source 53, and a diverging forward end part joined to the shower head 50 so that the open end thereof is covered with the shower head 50. The film forming gas is supplied from the film forming gas source 53 through the inner guide member 25a and is delivered through the gas spraying holes 51 toward the stage 4.

Figure 2B:
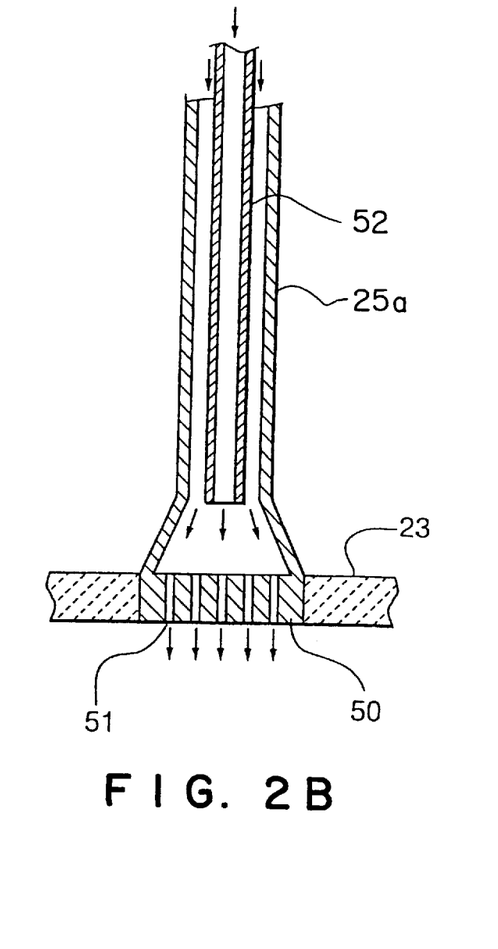
FIG. 2B is a sectional view of a gas supply part in a modification.

Suppose that two or more kinds of gases are to be supplied through the gas spraying holes 51 into the vacuum vessel 2. The two or more kinds of gases may be supplied from gas sources through the inner guide member 25a or an inner pipe 52 may be extended in the inner guide member 25a coaxially with the latter as shown in FIG. 2B, the gases may be supplied separately through the inner pipe 52 and a space between the inner pipe 52 and the inner guide member 25a, and the gases may be mixed before the same are sprayed through the gas spraying holes 51.

Figure 3A:
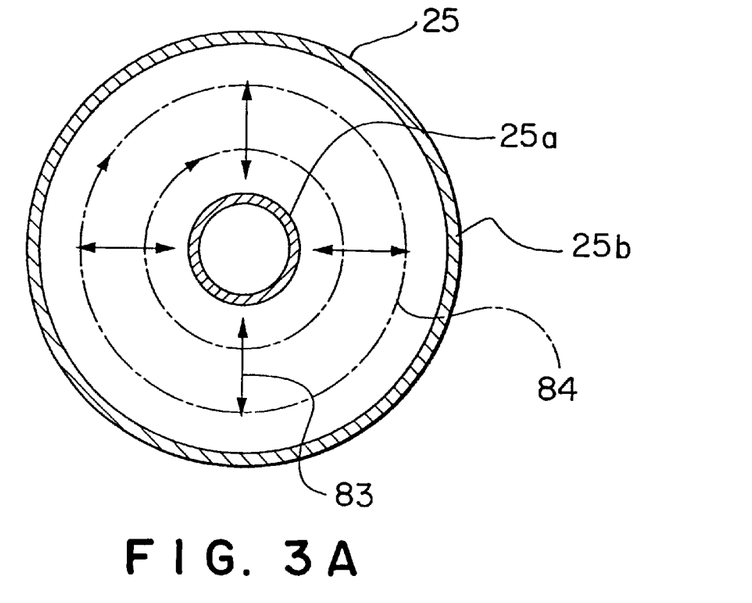
FIG. 3A is a cross-sectional view of a waveguide of assistance in explaining the TEM mode propagation of a microwave.
Figure 3B:
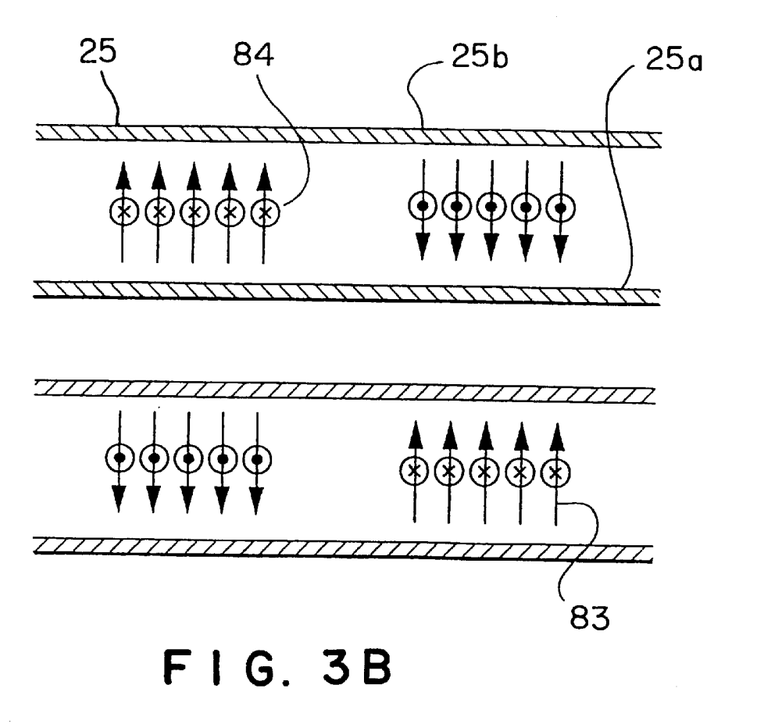
FIG. 3B is a longitudinal sectional view of a waveguide of assistance in explaining the TEM mode propagation of a microwave.

In this embodiment, the inner guide member 25a and the outer guide member 25b of the waveguide 25 have circular cross sections, respectively, and are combined in a coaxial arrangement, and a microwave is propagated in the TEM mode through the space between the inner guide member 25a and the outer guide member 25b. FIGS. 3A and 3B illustrate the propagation of the microwave in the TEM mode.

It is desirable that the height of the first vacuum chamber 21, i.e., the distance between the transparent plate 23 and a shoulder (around which an ECR point exits) at the boundary between the first vacuum chamber 21 and the second vacuum chamber 22, is smaller than a distance at which electrons produced by ionizing the film forming gas supplied into the first vacuum chamber 21 do not collide (mean free path) or below, for example, about 8 cm or below when the pressure in the first vacuum chamber 21 is 1 mtorr. If the height of the first vacuum chamber 21 is grater than the mean free path, the film forming gas will be dissolved by collision with electrons as the film forming gas flows through the first vacuum chamber 21, reaction products adhere to the inner surface of walls defining the first vacuum chamber 21 and will produce particles.

Gas nozzles 31 are placed on the side wall of the first vacuum chamber 21, for example, at equal circumferential intervals and are connected to a gas source, not shown, such as an AR gas source, to supply a plasma producing gas 81, such as Ar gas, uniformly into an upper region of the first vacuum chamber 21.

The stage 4, i.e., a support device, is disposed in the second vacuum chamber 22. A wafer is supported in a substantially horizontal position on the stage 4 so as to face the first vacuum chamber 21. The stage 4 is provided on its upper surface with an electrostatic chuck 41. Connected to the electrodes of the electrostatic chuck 41 are a dc power source, not shown, for supplying power to attract the wafer to the electrostatic chuck 41 and a high-frequency power source 42 for applying a bias voltage to the electrostatic chuck 41.

A main solenoid 26, i.e., a magnetic field creating means, is placed so as to surround the side wall of the first vacuum chamber 21. An auxiliary solenoid 27 is disposed under the second vacuum chamber 22. Discharge pipes 28 are connected to diametrically opposite parts of the bottom wall of the second vacuum chamber 22.

A method of forming a CF film as a layer insulating film on a wafer W, i.e., a workpiece, by the plasma processing apparatus will be described hereinafter. A gate valve, not shown, incorporated into the side wall of the vacuum vessel 2 is opened, a wafer W provided on a surface thereof with, for example, aluminum wiring lines is carried from a load lock chamber into the vacuum vessel 2 by a wafer carrying arm, not shown. The wafer W is mounted on the stage 4 and is held firmly on the stage 41 by the electrostatic chuck 41 by electrostatic attraction.

Figure 4:
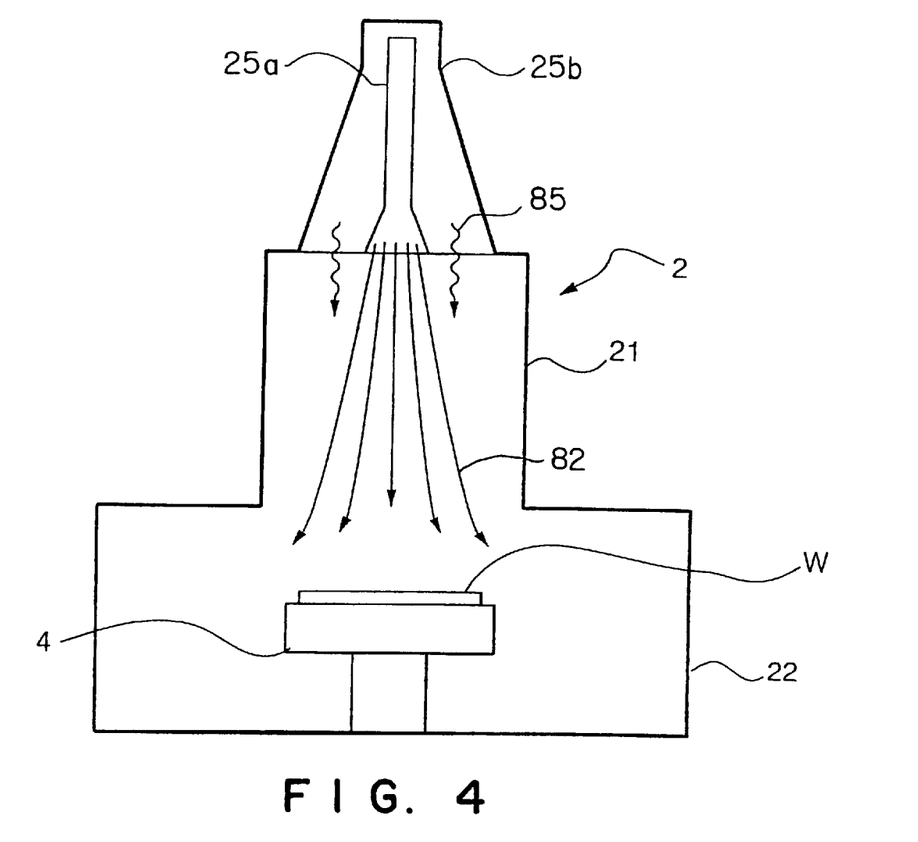
FIG. 4 is a typical view of the plasma processing apparatus shown in FIG. 1, showing the propagation of a microwave and the flow of a processing gas.

Subsequently, the gate valve is closed to seal the vacuum vessel 2, gases in the vacuum vessel 2 is discharged through the discharge pipes 28 to evacuate the vacuum vessel 2 to a predetermined vacuum. The plasma producing gas 81, such as Ar gas is supplied through the gas nozzles 31 into the first vacuum chamber 21 and the film forming gas 82, such as a mixed gas of $C_4F_8$ gas and $C_2H_4$ gas, is supplied through the shower head 50 into the first vacuum chamber 21 at a predetermined flow rate. As shown in FIG. 4, the film forming gas 82 supplied through the gas spray holes 51 of the shower head 50 into the first vacuum chamber 21 flows downward into the second vacuum chamber 22. The interior of the vacuum vessel 2 is maintained at a predetermined process pressure, bias power of, for example, 13.56 MHz and 1500 W is applied to the stage 4 by the high-frequency power source 42 and the stage 42 is heated at a surface temperature of about 400° C.

A high-frequency wave 85 of 2.45 GHz generated by the high-frequency power source 24 is guided through the space between the inner guide member 25a and the outer guide member 25b of the waveguide 25 to the ceiling of the vacuum vessel 2. The high-frequency wave 85 travels through the transparent plate 23 into the first vacuum chamber 21 as shown in FIG. 4. The high-frequency wave 85 is a microwave, a UHF wave or a VHF wave of a frequency in the range of, for example, several megahertz to several tens gigahertz. The solenoids 26 and 27 creates a magnetic field represented by magnetic lines of force extending from an upper region of the first vacuum chamber 21 toward a lower region of the second vacuum chamber 22. For example, the intensity of the magnetic field in a lower region of the first vacuum chamber 21 is 875 G. Electron cyclotron resonance is caused in the ECR point by the interaction of the magnetic field and the microwave, the Ar gas is ionized by electron cyclotron resonance in a high-density plasma. The plasma flowed from the first vacuum chamber 21 into the second vacuum chamber 22 activates $C_4F_8$ gas and $C_2H_4$ gas to produce active species to deposit a CF film on the wafer W. The film forming gas may be a mixture of $C_4F_8$ gas and $H_2$ gas or may be a CF gas.

Figure 5:
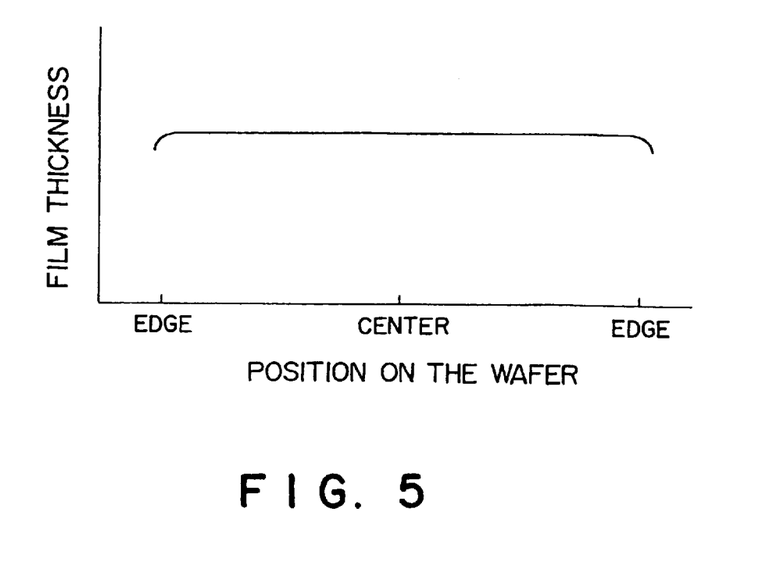
FIG. 5 is a graph showing a thickness distribution in a CF film formed by using the plasma processing apparatus shown in FIG. 1.

Since the film forming gas 82 is supplied through the ceiling of the vacuum vessel 2 facing the stage 4, the film forming gas 82 flows through a space extending over the wafer W supported on the stage 4 and filled with the plasma of uniform density and is dissociated before reaching the wafer W. Therefore, active species produced by the dissociation of the film forming gas fall uniformly on the surface of the wafer W in a thin CF film of a uniform thickness. The inventors of the present invention formed a CF film on a wafer by the foregoing film forming method embodying the present invention and examined the distribution of the thickness of the CF film. As shown in FIG. 5, the CF film had a uniform thickness over the entire surface of the wafer including a peripheral region and a central region. Where as the thickness uniformity of a CF film formed on an 8 in. wafer by the conventional plasma processing apparatus shown in FIG. 11 was ±15%, the thickness uniformity of a CF film formed on an 8 in. wafer by the plasma processing apparatus of the present invention was ±5%.

The shower head 50 and the inner guide member 25a formed of conductive materials, respectively, provide the following advantages. The space defined by the shower head 50 and the inner guide member 25a is not affected by an electric field created by the microwave. Therefore, the gas flowing through the space does not undergo ionization, any reaction products are not produced and the gas spray holes are not clogged with reaction products. Since the guide member (the shower head 50) is disposed in a direction parallel to the magnetic lines of force as viewed from the electrodes of the stage 4 to which a bias voltage is applied, the stage 4 can be easily biased.

Figure 6:
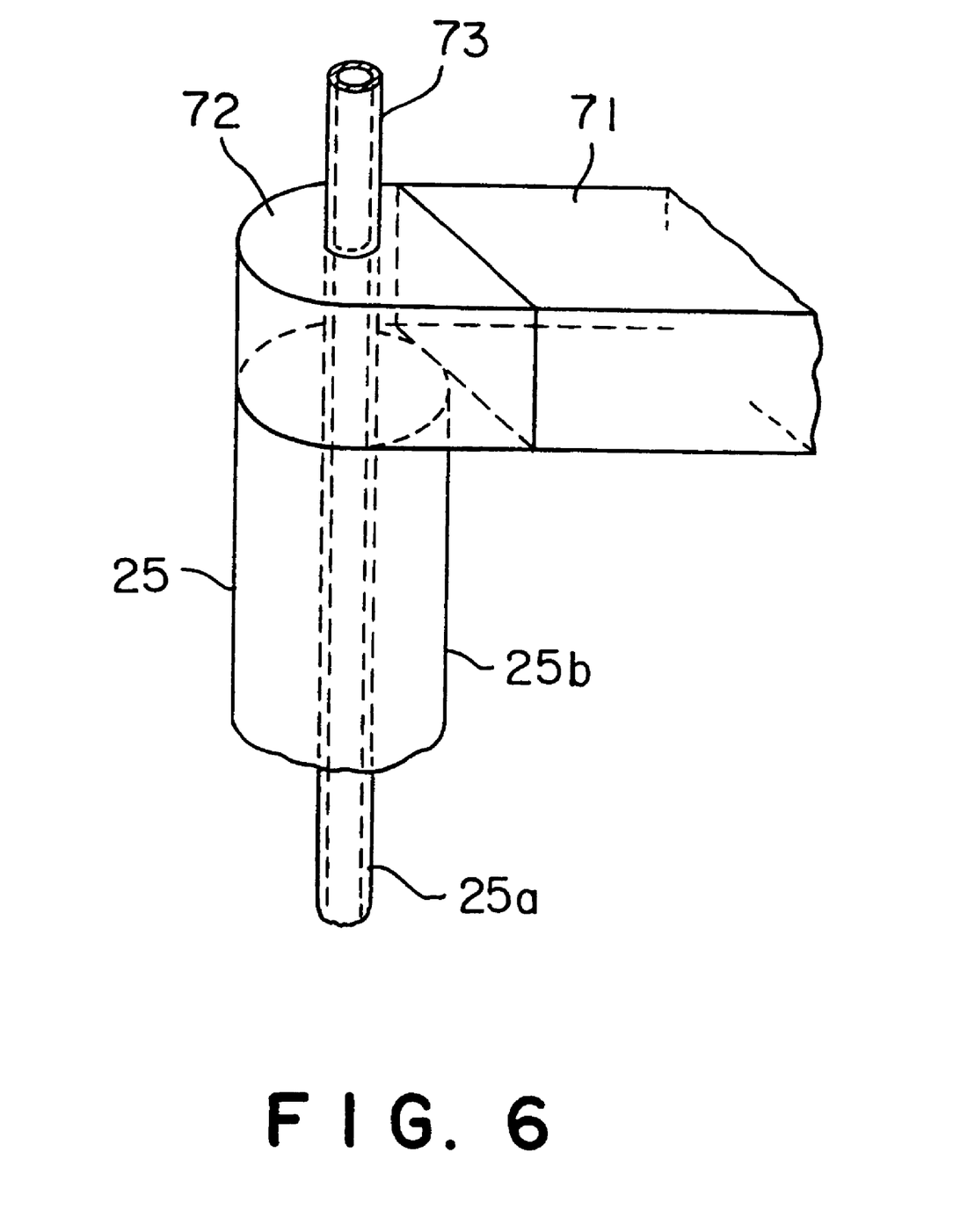
FIG. 6 is a perspective view of a waveguide and a gas supply pipe connected to the waveguide.

In the plasma processing apparatus shown in FIG. 1, the a gas supply pipe 73 may be connected to the inner guide member 25a as shown in FIG. 6; that is, the microwave is transmitted from the high-frequency power source through a waveguide 71, the mode of transmission of the microwave is changed and the direction of propagation of the microwave is changed perpendicularly by a converter 72, and the microwave is guided down toward the vacuum vessel by the outer guide member 25b of the waveguide 25. The gas supply pipe 73 is inserted through the converter 72 into the outer guide member 25b so as to extend coaxially with the outer guide member 25b and is connected to the inner guide member 25a to supply the gas into the vacuum vessel. When the gas supply pipe 73 is thus connected to the inner guide member 25a, the high-frequency power source does not need to be disposed on a gas supply path, which increases the degree of freedom of design.

Although the plasma processing apparatus in this embodiment supplies the film forming gas through the inner guide member 25a and the plasma producing gas is supplied through the gas nozzles 31, the plasma processing apparatus may use any gases for processing wafers.

Figure 7:
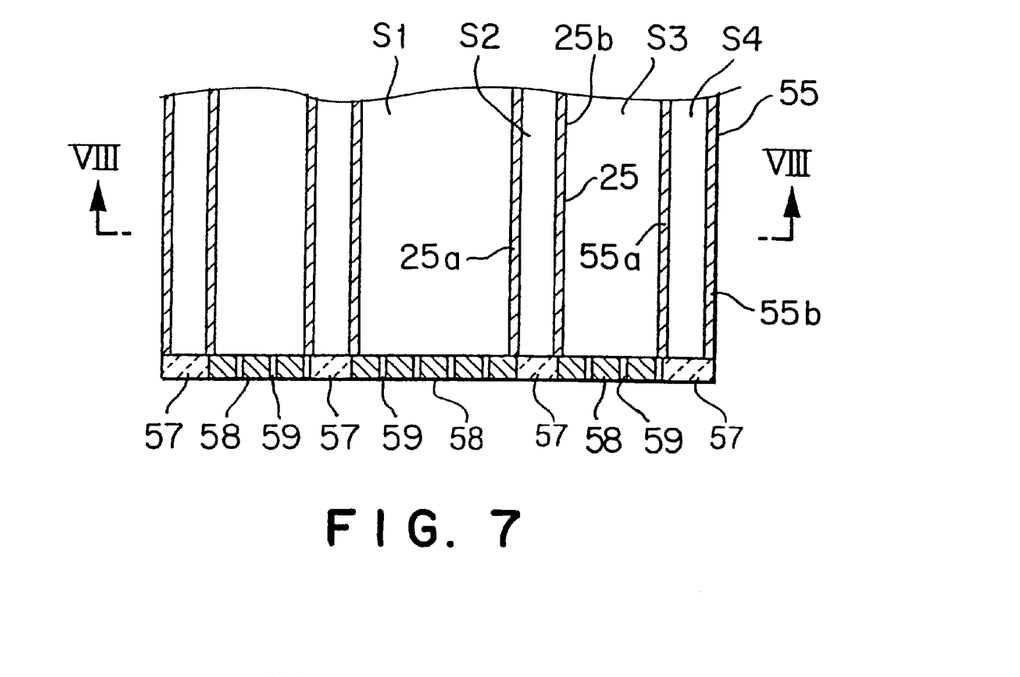
FIG. 7 is a fragmentary, longitudinal sectional view of a waveguide included in a plasma processing apparatus in a second embodiment according to the present invention.
Figure 8:
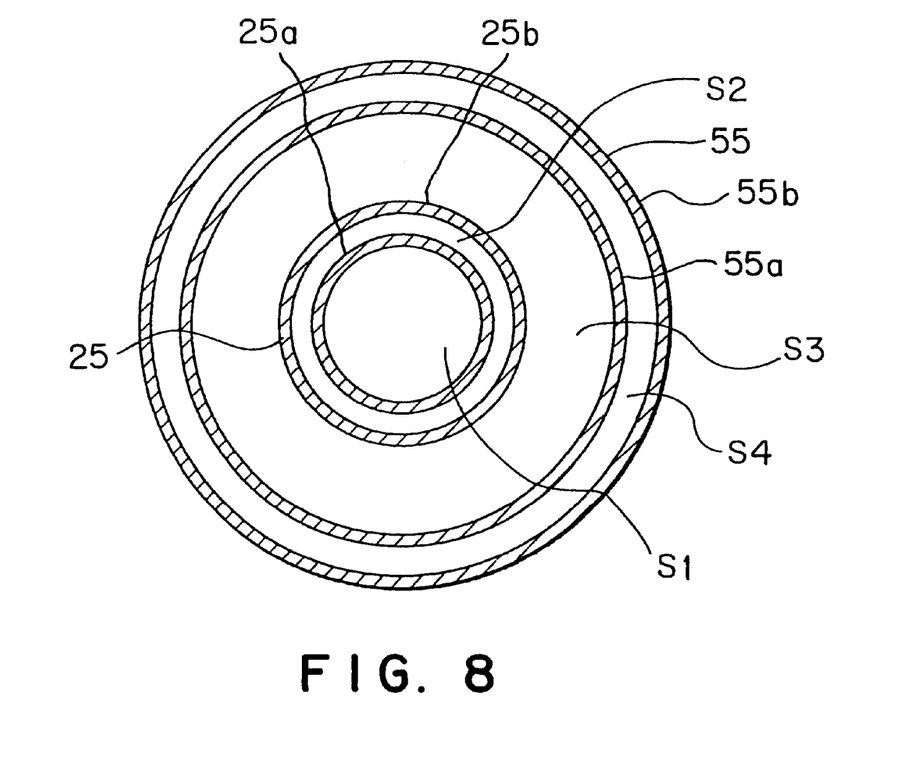
FIG. 8 is a sectional view taken on line VIII—VIII in FIG. 7.

FIGS. 7 and 8 show a waveguide employed in a plasma processing apparatus in a second embodiment according to the present invention. The plasma processing apparatus in the second embodiment is provided with a first waveguide 25 similar to the waveguide 25 of the first embodiment, and a second waveguide 55 coaxially surrounding the first waveguide 25. In the second embodiment, the first waveguide 25 has, in a coaxial arrangement, a first inner guide member 25a and a first outer guide member surrounding the first inner guide member 25a The second waveguide 55 has, in a coaxial arrangement, a second inner guide member 44a and a second outer guide member 55b surrounding the second inner guide member 55a A film forming gas is supplied through a space S1 in the first guide member 25a and a space S3 between the first outer guide member 25b and the second inner guide member 55a Microwaves are propagated through a space S2 between the first inner conducive member 25a and the first outer guide member 25b and a space S4 between the second inner guide member 55a and the second outer guide member 55b. Shower heads 58 of a conductive material are attached to the waveguides 25 and 55 so as to close the lower open ends of the spaces S1 and S3, and transparent plates 57 of a dielectric material are attached to the waveguides 25 and 55 so as to cover the lower open ends of the spaces S2 and S4. Indicated at 59 are gas spraying holes. The spaces S1 and S3 serving as film forming gas passages are connected to a film forming gas source 53 (FIG. 1), and the spaces S2 and S4 serving as microwave propagation passages are connected to a high-frequency power source 24 (FIG. 1).

Microwaves propagated through the spaces S2 and S4 may be either the same microwaves or different microwaves.

Figure 9:
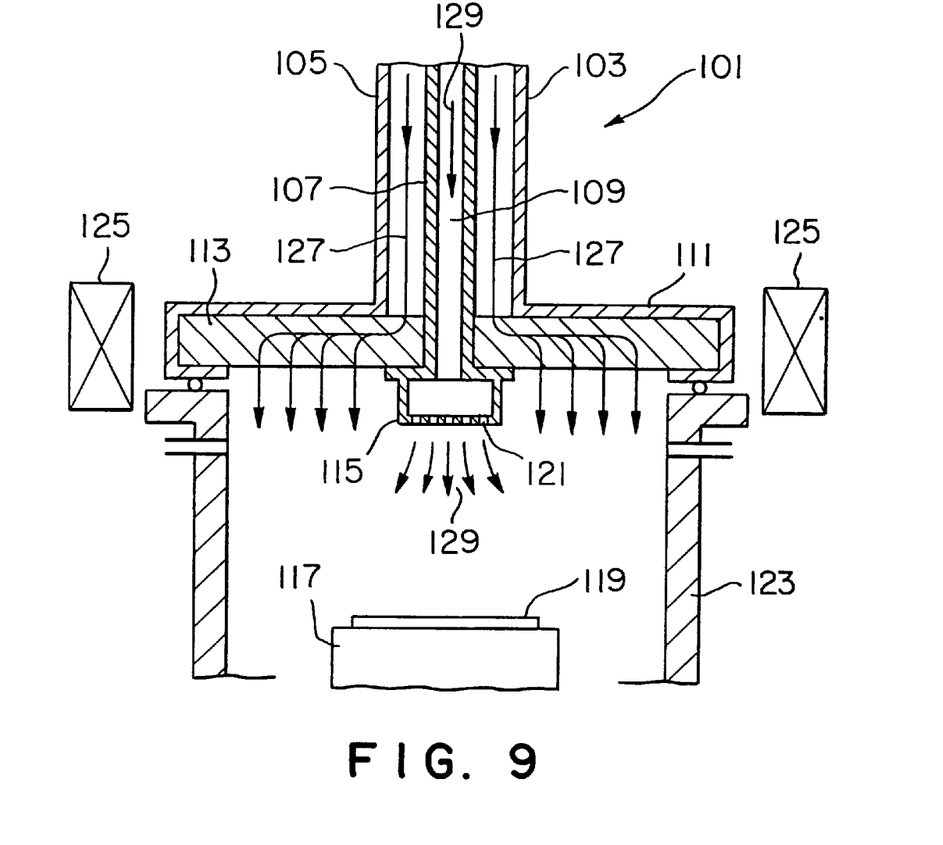
FIG. 9 is a sectional view of an essential part of a leak antenna employed in a plasma processing apparatus in a third embodiment according to the present invention.

FIG. 9 shows a leak antenna 110 employed in a plasma processing apparatus in a third embodiment according to the present invention.

In FIG. 9, indicated at 103 is a waveguide having coaxial pipes. The waveguide 103 has a cylindrical outer guide member 105 and an inner guide member 107 coaxially extended in the outer guide member 105. The inner guide member 107 defines a cylindrical gas supply passage 109. An end part of the outer guide member 105 is provided with a cylindrical antenna cover 111 of a conductive material extending radially in the shape of a flange and downward. A microwave transmitting plate 113 of a dielectric material, such as alumina ($Al_2O_3$) of silica ($SiO_2$), is placed between the inside of the antenna cover 111 and the lower end of the inner guide member 107. A shower head 115 is attached to the lower end of the inner guide member 107. The shower head 115 is formed of a conductive material and is provided with a plurality of gas spraying holes 121 opening toward a wafer 119 mounted on a stage 117. The leak antenna 101 is fixed hermetically to a vacuum vessel 123. A magnetic field creating device 125 is disposed so as to surround the leak antenna 101.

In this leak antenna 101, a microwave 127 is propagated through a space between the outer guide member 105 and the inner guide member 107. The microwave 127 spreads radially in the TEM mode in the microwave transmitting plate 113 and creates a leak electric field in the vacuum vessel 123. A processing gas 129 is supplied through the gas supply passage 109 in the inner guide member 107 toward a wafer 119 placed in the vacuum vessel 123.

Since the processing gas can be uniformly supplied through the inner guide member 107 over the wafer 119, the wafer 119 can be uniformly processed.

Figure 10:
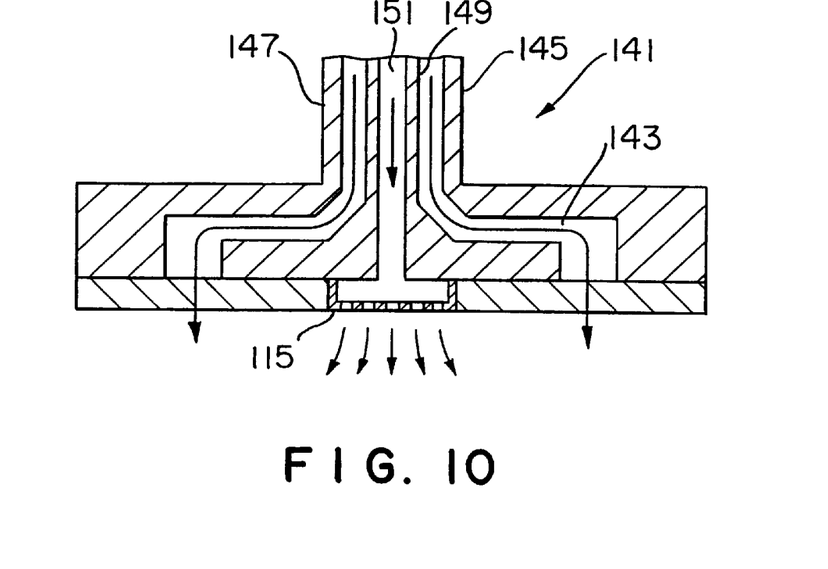
FIG. 10 is schematic sectional view of a leak antenna in a modification of the leak antenna employed in the plasma processing apparatus in the third embodiment.

FIG. 10 shows an advanced ECR antenna 141 in a modification of the leak antenna employed in the plasma processing apparatus in the third embodiment. The antenna 141 is used for processing wafers of a great diameter. A microwave generated by a magnetron is uniformed by a cavity resonator 143 and causes ECR resonance in a vacuum chamber to produce a plasma. In this antenna, 141, the microwave is propagated through a space between an outer guide member 147 and an inner guide member 149 of a waveguide 145, and a gas is supplied through a gas supply passage 151 defined by the inner guide member 149. The antenna 141 is capable of uniformly supplying the gas over a wafer disposed in a vacuum vessel to prevent irregular processing.

The present invention is applicable to forming a film other than the CF film. When forming a silicon dioxide film by the plasma processing apparatus of the present invention, silane gas is used as a film forming gas, and a plasma producing gas, such as Ar gas or $O_2$ gas, is supplied through the gas nozzles 31. The plasma processing apparatus of the present invention is not limited in its use to film forming apparatus, but may be used as an etching apparatus. When the plasma processing apparatus is used as an etching apparatus, the gas nozzles 31 for supplying a plasma producing gas is not used and an etching gas, such as carbon tetrachloride gas, is supplied through the shower head. The discharge pipes may be connected to lower parts of the side wall of the vacuum chamber and the solenoid for creating a magnetic field may be disposed beside the waveguide.

As apparent from the foregoing description, according to the present invention, the process gas is supplied through the shower head of a conductive material disposed opposite to a substrate to be processed. Therefore, the surface of the substrate can be uniformly processed by the plasma, and the contamination of the shower head with particles can be prevented because the plasma is not produced in the shower head.

What is claimed is:

1. A plasma processing apparatus comprising:

a vacuum vessel;

a stage disposed in the vacuum vessel to support a substrate thereon;

a waveguide connected to the vacuum vessel from outside the vacuum vessel, the waveguide having a cylindrical outer guide member and a cylindrical inner guide member extended in the outer guide member, so as to propagate a high-frequency wave through a space between the outer guide member and the inner guide member into the vacuum vessel and so as to supply a reactive gas through the inner guide member into the vacuum vessel from a position opposite the stage; a high-frequency wave transmitting plate of a dielectric material disposed opposite to the stage and hermetically separating the space between the outer guide member and the inner guide member from a space defined by the vacuum vessel; and a shower head of a conductive material, disposed to cover an end opening of the inner guide member facing the stage, and provided with a plurality of gas spraying holes opening toward the stage, wherein the reactive gas supplied through the shower head into the vacuum vessel is ionized by the high-frequency wave propagated through the transmitting plate to produce a plasma, and the substrate is processed.

2. A plasma processing apparatus, comprising:

a vacuum vessel;

a stage disposed in the vacuum vessel to support a substrate thereon;

a first waveguide connected to the vacuum vessel from outside the vacuum vessel, the first waveguide having a cylindrical first outer guide member and a cylindrical first inner guide member coaxially extended in the outer guide member, so as to propagate a high-frequency wave through a space between the first outer guide member and the first inner guide member into the vacuum vessel and so as to supply a reactive gas through the first inner guide member into the vacuum vessel from a position opposite the stage;

a second waveguide connected to the vacuum vessel from outside the vacuum vessel, the second waveguide having a second inner guide member coaxially surrounding the first waveguide and a second outer guide member coaxially surrounding the second inner guide member, so as to propagate a high-frequency wave through a space between the second inner guide member and the second outer guide member in to the vacuum vessel and so as to supply a reactive gas through a space between the second inner guide member and the first outer guide member into the vacuum vessel from a position opposite the stage;

a first high-frequency wave transmitting plate of a dielectric material disposed opposite to the stage and hermetically separating the space between the first outer guide member and the first inner guide member from a space defined by the vacuum vessel;

a second high-frequency wave transmitting plate of a dielectric material disposed opposite to the stage and hermetically separating the space between the second outer guide member and the second inner guide member from the space defined by the vacuum vessel;

a first shower head of a conductive material, disposed in an end of the first inner guide member facing the stage, and provided with a plurality of gas spraying holes opening toward the stage; and a second shower head of a conductive material, disposed between an end of the first outer guide member facing the stage and an end of the second inner guide member facing the stage, and provided with a plurality of gas spraying holes opening toward the stage, wherein the reactive gas supplied through the first shower head and the second shower head into the vacuum vessel is ionized by the high-frequency wave propagated through the first transmitting plate and the second transmitting plate to produce a plasma, and the substrate is processed.

3. A plasma processing apparatus, comprising:

a vacuum vessel;

a stage disposed in the vacuum vessel to support a substrate thereon;

a waveguide connected to the vacuum vessel from outside the vacuum vessel, the waveguide having a cylindrical outer guide member and a cylindrical inner guide member coaxially extended in the outer guide member, so as to propagate a high-frequency wave through a space between the outer guide member and the inner guide member into the vacuum vessel and so as to supply a reactive gas through the inner guide member into the vacuum vessel from a position opposite the stage;

a shower head of conductive material, disposed in an end of the inner guide member facing the stage, and provided with a plurality of gas spraying holes opening toward the stage, wherein an end part of the outer guide member of the waveguide facing the stage is provided with an antenna cover of a conductive material radially extending in the shape of a flange and axially extending toward the stage, a microwave transmitting plate of a dielectric material disposed between the inside of the antenna cover and an end of the inner guide member facing the stage so as to separate a space between the outer guide member and the inner guide member from a space defined by the vacuum vessel, so that a microwave is propagated through an annular space between the outer guide member and the inner guide member and through the microwave transmitting plate radially extending in the shape of a flange from the end of the outer guide member, and wherein a reactive gas supplied through the shower head into the vacuum vessel is ionized by a predetermined high-frequency wave transmitted through the microwave transmitting plate, and the substrate is processed.

4. The plasma processing apparatus according to any one of claims 1, 2, or 3, further comprising a magnetic field creating device to create a predetermined magnetic field in the vacuum vessel, wherein an ECR plasma is produced by interaction of the high-frequency wave and the predetermined magnetic field.

5. The plasma processing apparatus according to any one of claims 1, 2, or 3, wherein the reactive gas is a film forming gas containing carbon and fluorine.

6. The plasma processing apparatus according to any one of claims 1, 2, or 3, wherein the reactive gas is an etching gas.

* * * * *